United States Patent
Choi et al.

(10) Patent No.: US 9,657,385 B2
(45) Date of Patent: May 23, 2017

(54) METHOD OF MANUFACTURING THERMOCHROMIC SUBSTRATE

(71) Applicant: Samsung Corning Precision Materials Co., Ltd., Gyeongsangbuk-do (KR)

(72) Inventors: Yong Won Choi, ChungCheongNam-Do (KR); Yung-Jin Jung, ChungCheongNam-Do (KR); Hyun Bin Kim, ChungCheongNam-Do (KR); Seulgi Bae, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 412 days.

(21) Appl. No.: 13/712,086

(22) Filed: Dec. 12, 2012

(65) Prior Publication Data

US 2013/0149441 A1 Jun. 13, 2013

(30) Foreign Application Priority Data

Dec. 12, 2011 (KR) ........................ 10-2011-0133152

(51) Int. Cl.
*C23C 14/00* (2006.01)
*C23C 14/32* (2006.01)
(Continued)

(52) U.S. Cl.
CPC .............. *C23C 14/08* (2013.01); *B05D 5/065* (2013.01); *C03C 17/3417* (2013.01);
(Continued)

(58) Field of Classification Search
CPC ............................ C23C 14/022; C23C 14/08
See application file for complete search history.

(56) References Cited

U.S. PATENT DOCUMENTS

2002/0037421 A1* 3/2002 Arnaud et al. ................ 428/472
2005/0147825 A1 7/2005 Arnaud et al.

FOREIGN PATENT DOCUMENTS

CN 102030485 A 4/2011
DE 19860026 A1 12/1999
(Continued)

OTHER PUBLICATIONS

Yong-Hee Han, In-Hoon Choi, Ho-Kwan Kang, Jong-Yeon Park, Kun-Tae Kim, Hyun-Joon Shin, Sung Moon, Fabrication of vanadium oxide thin film with high-temperature coefficient of resistance using V2O5/V/V2O5 multi-layers for uncooled microbolometers, Thin Solid Films, vol. 425, Issues 1-2, Feb. 3, 2003, pp. 260-264, ISSN 0040-6090.*

(Continued)

*Primary Examiner* — Ibrahime A Abraham
(74) *Attorney, Agent, or Firm* — Lerner, David, Littenberg, Krumholz & Mentlik, LLP

(57) ABSTRACT

A method of manufacturing a thermochromic substrate, with which transmittance can be increased. The method includes the steps of forming a first thin film as a coating on a base substrate, the refractive index of the first thin film being different from that of a $VO_2$ thin film; forming a pre-thermochromic thin film by coating the first thin film with pure vanadium; forming a second thin film as a coating on the pre-thermochromic thin film, the refractive index of the second thin film being different from that of a $VO_2$ thin film; and heat-treating a resultant stack that includes the base substrate, the first thin film, the pre-thermochromic thin film and the second thin film.

9 Claims, 4 Drawing Sheets

(51) Int. Cl.
  *C23C 14/08* (2006.01)
  *B05D 5/06* (2006.01)
  *C23C 14/02* (2006.01)
  *C03C 17/34* (2006.01)
  *G02F 1/01* (2006.01)
(52) U.S. Cl.
  CPC ...... *C23C 14/022* (2013.01); *C03C 2218/322* (2013.01); *G02F 1/0147* (2013.01)

(56) References Cited

FOREIGN PATENT DOCUMENTS

| EP | 0657562 A2 | 6/1995 |
| JP | 2007322849 A | 12/2007 |
| WO | 2006098451 A1 | 9/2006 |

OTHER PUBLICATIONS

"VO2 films with strong semiconductor to metal phase transition prepared by the precursor oxidation process", M. Gurvitch et al, Journal of Applied Physics, vol. 102, pp. 033504-1 to 033504-13 (Aug. 3, 2007).

* cited by examiner

METHOD OF MANUFACTURING THERMOCHROMIC SUBSTRATE

CROSS REFERENCE TO RELATED APPLICATION

The present application claims priority from Korean Patent Application Number 10-2011-0133152 filed on Dec. 12, 2011, the entire contents of which application are incorporated herein for all purposes by this reference.

BACKGROUND OF THE INVENTION

Field of the Invention

The present invention relates to a method of manufacturing a thermochromic substrate, and more particularly, to a method of manufacturing a thermochromic substrate, by which the transmittance of the thermochromic substrate can be increased.

Description of Related Art

Thermochromism refers to the phenomenon in which an oxide or a sulfide of a transition metal undergoes a change in its crystal structure below and above a specific temperature (i.e. a transition temperature (Tc)), so that its physical properties (electrical conductivity and infrared (IR) transmittance) suddenly change.

When a glass is coated with a thin film that has such thermochromic capability, a "smart window" can be produced, which transmits visible light but blocks near infrared rays and infrared rays at or above a predetermined temperature in order to prevent the indoor temperature from increasing. The application of smart windows to vehicles or buildings may be very effective in saving energy. Materials that exhibit thermochromism include oxides of several transition metals, of which vanadium dioxide ($VO_2$) is being studied since its transition temperature is 68° C., which is relatively close to a temperature at which practical application becomes possible.

Vanadium oxides, such as $VO_2$, are present in the form of a variety of crystalline phases, such as $V_2O_3$, $V_3O_5$, $V_4O_7$, $V_6O_{11}$, $V_5O_9$, $V_6O_{13}$, $V_4O_9$, $V_3O_7$, $V_2O_5$ and $VO_2$. The thermochromic characteristics appear only in the crystalline phase of $VO_2$.

Therefore, in order to transform vanadium oxides that are present in a variety of crystalline phases, such as $V_2O_3$, $V_3O_5$, $V_4O_7$, $V_5O_9$, $V_6O_{11}$, $V_6O_{13}$, $V_4O_9$, $V_3O_7$, $V_2O_5$ and $VO_2$, into $VO_2$ in the crystalline phase, a method of heating a glass substrate to a high temperature and then coating the glass substrate with a vanadium oxide, a method of coating a glass substrate with a vanadium oxide, followed by post annealing, and the like are used.

However, the thermochromic thin film that is manufactured by the foregoing method exhibits the characteristics of metal and a resultant low transmittance of visible light, which are drawbacks.

In order to increase the transmittance of visible light, a method of decreasing the thickness of the thermochromic thin film can be used. However, this causes the problem in which the phase transition characteristic of the thermochromic thin film becomes nonuniform.

Therefore, a method of increasing the transmittance of visible light by forming a multilayer film structure, which includes a low-refractivity thin film and/or a high-refractivity thin film in addition to the thermochromic thin film, is used.

In this method of forming the multilayer film structure of the related art, the multilayer film structure is produced by forming a high- or low-refractivity thin film as an underlying layer, coating the high- or low-refractivity thin film with a $VO_2$ thin film, and then coating the $VO_2$ thin film with a high- or low-refractivity thin film.

However, when the multilayer film structure is manufactured by this method, the $VO_2$ thin film is oxidized during the process of forming the multilayer film structure. Then, the $VO_2$ undergoes phase change into a different crystalline phase of vanadium oxide, such as $V_2O_3$ or $V_2O_5$, which is problematic.

Specifically, when the high- or low-refractivity thin film formed as the underlying layer is coated with the $VO_2$ thin film, oxygen diffuses in the underlying thin film in a high-temperature atmosphere, in which the $VO_2$ thin film is formed as a coating. Consequently, the $VO_2$ undergoes a phase change into a different crystalline phase of vanadium oxide.

In addition, when the $VO_2$ thin film is coated with the high- or low-refractivity thin film, the $VO_2$ thin film is exposed to oxygen in reactive sputtering, in which the high- or low-refractivity thin film is formed as a coating. The oxygen then diffuses into the $VO_2$ thin film, and thus the $VO_2$ undergoes phase change into a different crystalline phase of vanadium oxide.

Accordingly, when the multilayer film structure for increasing the transmittance of the thermochromic glass is formed by the method of the related art, oxygen diffuses into the $VO_2$ thin film in the process of forming the multilayer film structure, and thus the $VO_2$ undergoes a phase change, thereby losing its thermochromic characteristics.

The information disclosed in this Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a method of manufacturing a thermochromic substrate, with which the thermochromic substrate can have increased transmittance while maintaining the thermochromic characteristics thereof.

In an aspect of the present invention, provided is a method of manufacturing a thermochromic substrate. The method includes the steps of: forming a first thin film as a coating on a base substrate; forming a pre-thermochromic thin film as a coating on the first thin film; forming a second thin film as a coating on the pre-thermochromic thin film; and modifying the pre-thermochromic thin film into a thermochromic thin film by heat-treating a resultant stack that includes the base substrate, the first thin film, the pre-thermochromic thin film and the second thin film. Each refractive index of the first thin film and the second thin film is different from that of the thermochromic thin film.

In an exemplary embodiment, the thermochromic thin film may have a composition of AxBy, which is a thermochromic material, and the pre-thermochromic thin film may have a composition of AxBz, where A is a metal, and y>z.

Here, z may be 0 or greater than 0. In an example, if A is vanadium (V) and z is 0, the pre-thermochromic thin film is a pure vanadium thin film. On the other hand, if A is vanadium and z is greater than 0, the pre-thermochromic thin film is a vanadium oxide thin film. The pre-thermochromic thin film may be formed, for example, by coating the first thin film with vanadium while providing oxygen.

In an exemplary embodiment, the thermochromic thin film may be made of one selected from the group consisting of vanadium dioxide ($VO_2$), titanium oxide (III) ($Ti_2O_3$) and niobium oxide ($NbO_2$).

In an exemplary embodiment, when the pre-thermochromic thin film contains pure vanadium, the pure vanadium is converted into vanadium dioxide ($VO_2$) due to the step of heat-treating the resultant stack.

In an exemplary embodiment, the first thin film and the second thin film may be a transparent oxide thin film or a transparent nitride thin film. It is preferred that the transparent oxide thin film or the transparent nitride thin film may be made of at least one selected from among silicon dioxide ($SiO_2$), niobium pentoxide ($Nb_2O_5$), aluminum oxide ($Al_2O_3$), titanium dioxide ($TiO_2$), and silicon nitride ($Si_3N_4$). Here, at least one of the first thin film and the second thin film must be an oxide thin film.

In an exemplary embodiment, each thickness of the first thin film, the pre-thermochromic thin film and the second thin film may range from 30 nm to 80 nm.

In an exemplary embodiment, the step of heat-treating the resultant stack may be performed in an argon (Ar) or vacuum atmosphere.

In an exemplary embodiment, the step of heat-treating the resultant stack may be performed at a temperature ranging from 400° C. to 500° C., and preferably at a temperature ranging from 400° C. to 500° C. for 20 to 120 minutes.

In an exemplary embodiment, oxygen may be provided when forming the pre-thermochromic thin film by coating the first thin film with vanadium.

In an exemplary embodiment, the step of forming the first thin film as the coating and the step of forming the second thin film as the coating may be performed via reactive sputtering deposition.

According to embodiments of the invention, it is possible to manufacture a thermochromic substrate having increased transmittance while maintaining the thermochromic characteristics thereof.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to a method of manufacturing a thermochromic substrate according to the present invention, embodiments of which are illustrated in the accompanying drawings and described below.

In the following description of the present invention, detailed descriptions of known functions and components incorporated herein will be omitted when they may make the subject matter of the present invention unclear.

Figure 1:
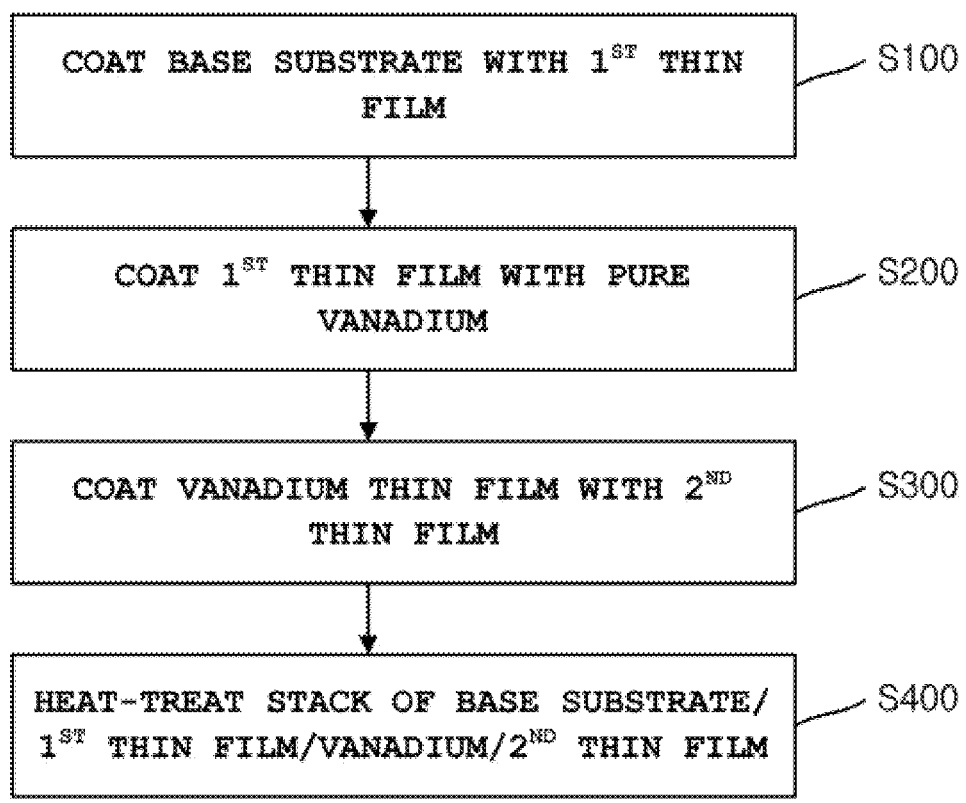
FIG. 1 is a flowchart schematically depicting a method of manufacturing a thermochromic substrate according to an exemplary embodiment of the invention.

FIG. 1 is a flowchart schematically depicting a method of manufacturing a thermochromic substrate according to an exemplary embodiment of the invention.

Referring to FIG. 1, the method of manufacturing a thermochromic substrate according to an exemplary embodiment of the invention may include the step of forming a first thin film, forming a pre-thermochromic thin film, forming a second thin film, and heat-treating the resultant structure.

In order to manufacture the thermochromic substrate, at step S100, a glass substrate is coated with a first thin film, the refractivity of the first thin film being different from that of a vanadium dioxide ($VO_2$) thin film.

The glass substrate is a transparent or colored substrate that has a predetermined area or thickness. It is preferred that the glass substrate be a sodalime glass.

The first thin film acts as a sodium diffusion barrier to prevent sodium (Na) ions in the glass substrate from diffusing into the pre-thermochromic thin film or $VO_2$ thin film, which will be described later, at a temperature of 350° C. or higher in the process of manufacturing the thermochromic substrate. Otherwise, the $VO_2$ thin film would lose the thermochromic characteristics thereof due to the sodium diffusion.

The first thin film is a thin film, the refractive index of which is different from that of the $VO_2$ thin film. The first thin film may be implemented as a transparent oxide thin film or a transparent nitride thin film. It is preferred that the first thin film be made of one material selected from among, but not limited to, silicon dioxide ($SiO_2$), niobium pentoxide ($Nb_2O_5$), aluminum oxide ($Al_2O_3$), titanium dioxide ($TiO_2$), and silicon nitride ($Si_3N_4$).

Although it is preferred that the thickness of the first film range from 30 nm to 80 nm, the thickness may vary depending on the type of coating materials, the refractivity of coating materials, and the like.

The first thin film may be formed on the glass substrate as a coating via reactive sputtering deposition.

After that, at step S200, the first thin film is coated with pure vanadium.

The first thin film can be coated with pure vanadium via a variety of deposition methods, such as sputtering deposition, including direct current (DC) sputtering deposition and radio frequency (RF) sputtering deposition.

The thickness of the pre-thermochromic thin film ranges, preferably, from 30 nm to 80 nm in consideration of the transmittance of visible light.

In addition, when the first thin film is coated with pure vanadium, a faint amount of oxygen may be provided in order to increase reactivity in the following heat treatment step.

Afterwards, at step S300, the pre-thermochromic thin film is coated with a second thin film, the refractive index of which is different from that of the $VO_2$ thin film.

The second thin film acts as a protective film that protects the thermochromic thin film from scratches or soiling.

The second thin film is a thin film, the refractive index of which is different from that of the $VO_2$ thin film, and may be implemented as a transparent oxide thin film or a transparent nitride thin film. It is preferred that the second thin film be made of one material selected from among, but not limited to, $SiO_2$, $Nb_2O_5$, $Al_2O_3$, $TiO_2$ and $Si_3N_4$. The first thin film and the second thin film may be made of the same material.

In particular, when the second thin film is provided as an oxide or nitride coating, the surface of the pre-thermochromic thin film may be oxidized or nitrified, and the phase of vanadium may be changed into $V_2O_5$ or VN instead of $VO_2$ in the heat treatment step, which will be described later, if oxygen or nitrogen is abundant. Therefore, it is required to provide a minimum amount of oxygen or nitrogen within the limits in which the second thin film maintains the characteristics thereof as an oxide thin film or a nitride thin film.

In addition, when oxygen is provided during the step of coating with the second thin film in order to increase the reactivity of the pre-thermochromic thin film in the following heat treatment step, it is preferred that a minimum amount of oxygen be provided.

Although it is preferred that the thickness of the second thin film range from 30 nm to 80 nm, the thickness may vary depending on the type of materials to be coated, the refractivity of coating materials, or the like.

The second thin film may be applied as a coating on the glass substrate via reactive sputtering deposition.

Finally, at step S400, the resultant stack, which includes the glass substrate, the first thin film, the pre-thermochromic thin film and the second thin film, is heat-treated, thereby producing a thermochromic substrate.

When the stack that includes the glass substrate, the first thin film, the pre-thermochromic thin film and the second thin film is heat-treated, oxygen in the first and second thin films diffuses into the pre-thermochromic thin film, so that pure vanadium undergoes phase change into $VO_2$.

The heat treatment may be performed in an argon (Ar) or vacuum atmosphere, preferably at a temperature ranging from 400° C. to 500° C., and more preferably at a temperature ranging from 400° C. to 500° C. for 20 to 120 minutes.

In this way, the thermochromic substrate is manufactured by the method according to an exemplary embodiment of the invention. Since the refractive index of light incident on the glass substrate is changed by the multilayer film structure that includes the first thin film, the $VO_2$ thin film and the second thin film, which is formed on the glass substrate, the thermochromic substrate has thermochromic characteristics while exhibiting improved transmittance.

That is, when the first thin film is formed on the glass substrate, the $VO_2$ thin film is formed on the first thin film, and the second thin film is formed on the $VO_2$ thin film in order to increase the transmittance of the thermochromic substrate as in the related art, the $VO_2$ undergoes a phase change into $V_2O_3$. $V_2O_5$, or the like due to an oxidation reaction in the $VO_2$ thin film, whereby the $VO_2$ thin film loses the thermochromic characteristics thereof, which is problematic. In contrast, the present invention has solved the problem of the related art, since pure vanadium is used and the $VO_2$ thin film is formed by diffusing oxygen into the pre-thermochromic thin film due to the heat treatment.

Figure 2:
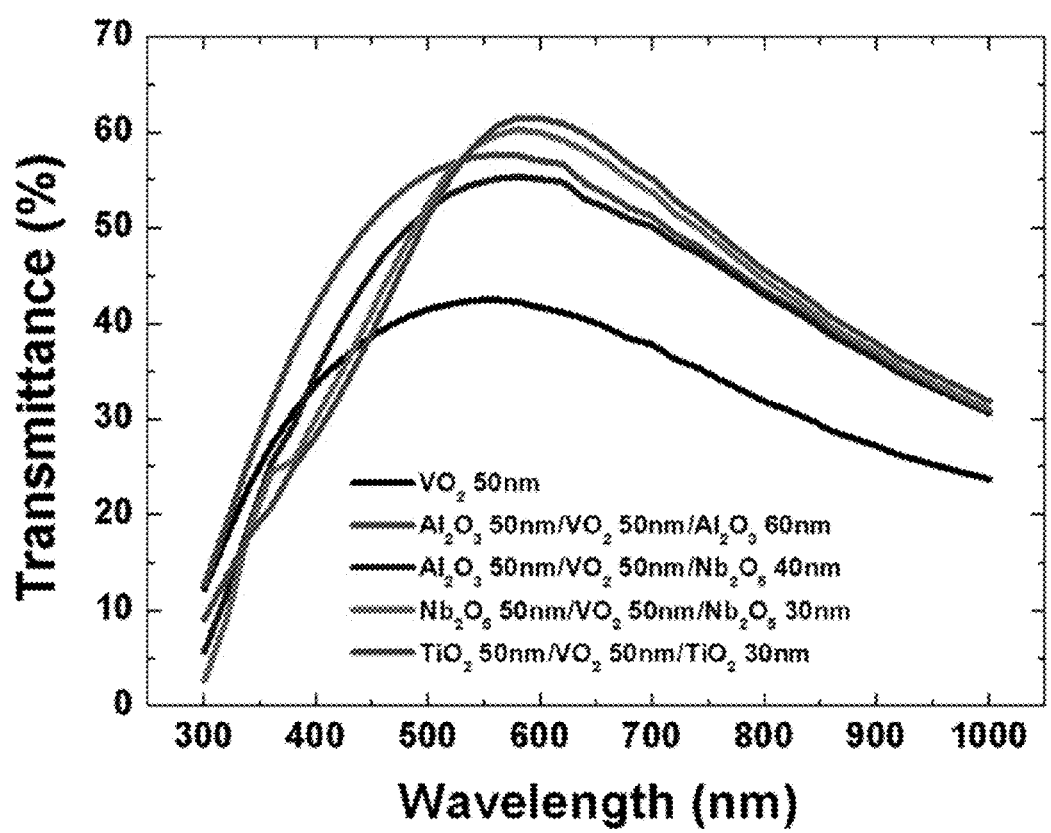
FIG. 2 is a graph comparatively depicting the transmittance of thermochromic substrates having a multilayer film structure, each of which is manufactured according to an example of the invention, and the transmittance of a thermochromic substrate having only a vanadium dioxide ($VO_2$) thin film.

FIG. 2 is a graph comparatively depicting the transmittance of thermochromic substrates having a multilayer film structure, each of which is manufactured according to an example of the invention, and the transmittance of a thermochromic substrate having only a vanadium dioxide ($VO_2$) thin film.

As shown in FIG. 2, it can be appreciated that the transmittance of the thermochromic substrates having the multilayer film structure, each of which is manufactured according to an example of the invention, is improved such that it is higher than that of the thermochromic substrate having only the $VO_2$ thin film.

Figure 3:
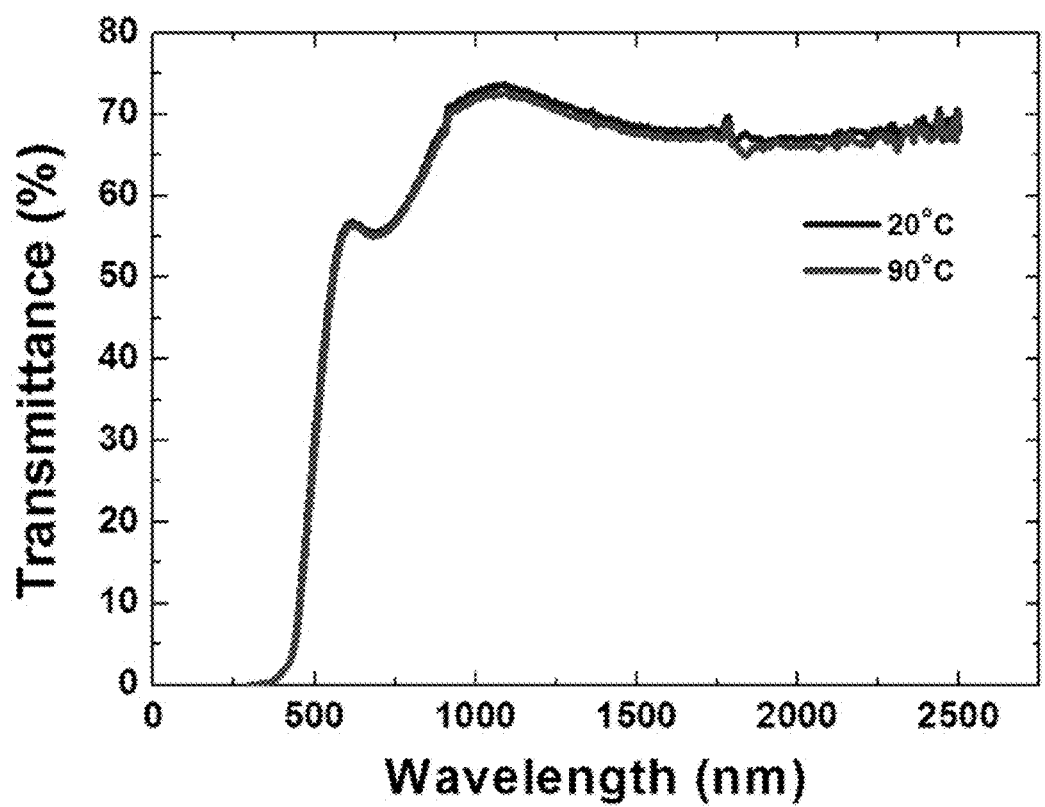
FIG. 3 is a graph depicting the thermochromic characteristics of a thermochromic substrate having a multilayer structure, which is manufactured by a method of the related art.
Figure 4:
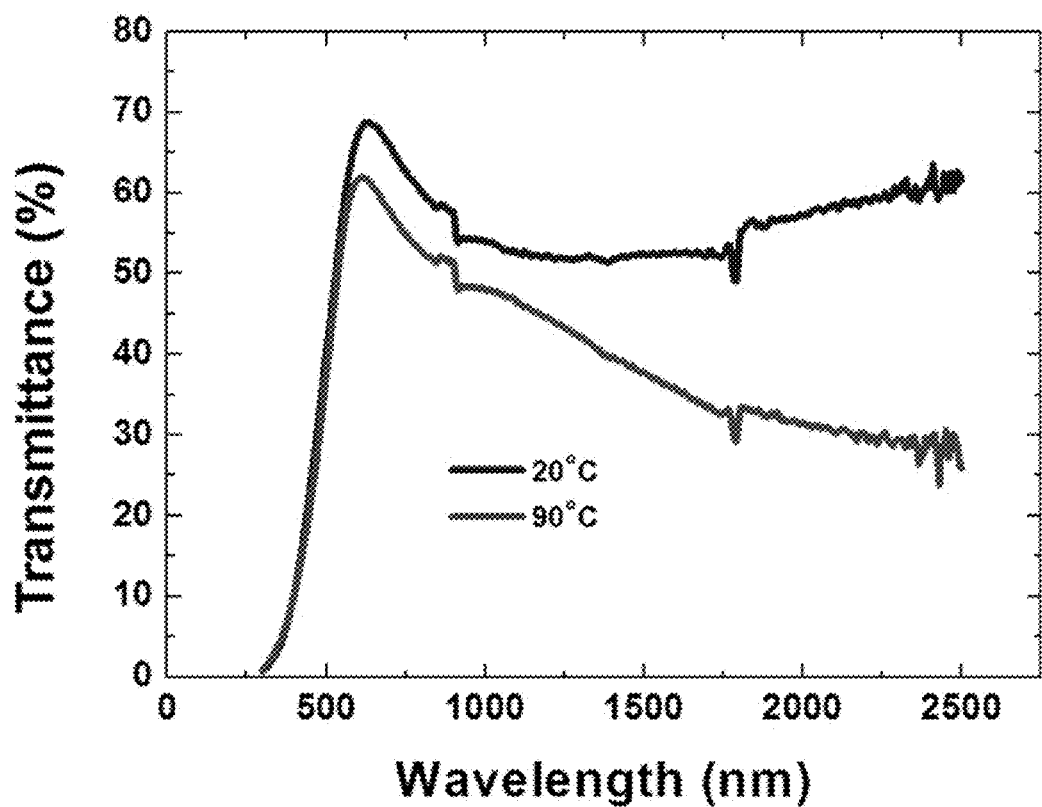
FIG. 4 is a graph depicting the thermochromic characteristics of a thermochromic substrate having a multilayer structure, which is manufactured according to an example of the invention.

FIG. 3 is a graph depicting the thermochromic characteristics of a thermochromic substrate having a multilayer structure, which is manufactured by a method of the related art, and FIG. 4 is a graph depicting the thermochromic characteristics of a thermochromic substrate having a multilayer structure, which is manufactured according to an example of the invention.

Comparing FIG. 3 and FIG. 4, it can be appreciated that the thermochromic substrate manufactured by the method of the related art exhibits no change in transmittance at temperatures ranging from 20° C. to 90° C.

Accordingly, in the thermochromic substrate manufactured by the method of the related art, which is intended to increase the transmittance of the thermochromic substrate, $VO_2$ undergoes phase change into $V_2O_3$, $V_2O_3$, or the like in the process of manufacturing the thermochromic substrate, whereby the $VO_2$ thin film loses its thermochromic characteristics. In contrast, the thermochromic substrate manufactured according to an embodiment of the invention, can have increased transmittance while maintaining the thermochromic characteristics thereof.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A method of manufacturing a thermochromic substrate, comprising:

coating a base substrate with a first thin film;

coating the first thin film with a pre-thermochromic thin film, the pre-thermochromic thin film comprising a composition having a formula $A_xB_z$, where A is a metal, and B is oxygen, and x and z are relative molar proportions of the metal A and of oxygen, respectively, wherein z can be zero or greater;

coating the pre-thermochromic thin film with a second thin film, wherein each of the first thin film and the second thin film comprises at least one of a transparent oxide thin film or a transparent nitride thin film, the transparent oxide thin film or the transparent nitride thin film comprises at least one selected from the group consisting of silicon dioxide ($SiO_2$), niobium pentoxide ($Nb_2O_5$), aluminum oxide ($Al_2O_3$), titanium dioxide ($TiO_2$), and silicon nitride ($Si_3N_4$), and at least one of the first thin film and the second thin film comprises an oxide thin film; and modifying the pre-thermochromic thin film into a thermochromic thin film having a formula $A_xB_y$, where x and y are relative molar proportions of the metal A and of oxygen, respectively, wherein a ratio of y to x in the formula for the thermochromic thin film is greater than a ratio of z to x in the formula for the pre-thermochromic thin film, the thermochromic thin film being one selected from the group consisting of vanadium dioxide ($VO_2$), titanium oxide (III) ($Ti_2O_3$) and niobium oxide ($NbO_2$), by heat-treating a resultant stack that includes the base substrate, the first thin film, the pre-thermochromic thin film and the second thin film, wherein heat-treating the resultant stack makes oxygen diffuse from at least one of the first thin film and the second thin film into the pre-thermochromic thin film, so that the pre-thermochromic thin film is modified into the thermochromic thin film, wherein each refractive index of the first thin film and the second thin film is different from that of the thermochromic thin film.

2. The method of claim 1, wherein z is 0.

3. The method of claim 1, wherein the pre-thermochromic thin film is formed by coating the first thin film with vanadium (V) while providing oxygen.

4. The method of claim 1, wherein the pre-thermochromic thin film comprises pure vanadium, which is to be converted into vanadium dioxide ($VO_2$) by heat-treating the resultant stack.

5. The method of claim 1, wherein each thickness of the first thin film, the pre-thermochromic thin film and the second thin film ranges from 30 nm to 80 nm.

6. The method of claim 1, wherein heat-treating the resultant stack is performed in an argon (Ar) or vacuum atmosphere.

7. The method of claim 1, wherein heat-treating the resultant stack is performed at a temperature ranging from 400° C. to 500° C.

8. The method of claim 7, wherein heat-treating the resultant stack is performed for 20 to 120 minutes.

9. The method of claim 1, wherein coating with the first thin film and coating with the second thin film are performed via reactive sputtering deposition.

* * * * *